(12) United States Patent
Fujiwara et al.

(10) Patent No.: US 11,997,843 B2
(45) Date of Patent: May 28, 2024

(54) 4CPP SRAM CELL AND ARRAY

(71) Applicant: Taiwan Semiconductor Manufacturing Company, Ltd., Hsinchu (TW)

(72) Inventors: Hidehiro Fujiwara, Hsinchu (TW); Chia-En Huang, Hsinchu (TW); Yen-Huei Chen, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 471 days.

(21) Appl. No.: 17/397,371

(22) Filed: Aug. 9, 2021

(65) Prior Publication Data
US 2021/0366915 A1 Nov. 25, 2021

Related U.S. Application Data

(63) Continuation of application No. 16/589,806, filed on Oct. 1, 2019, now Pat. No. 11,088,151.

(51) Int. Cl.
*H10B 10/00* (2023.01)
*G11C 5/06* (2006.01)
*H01L 27/092* (2006.01)
*H01L 29/66* (2006.01)
*H01L 29/78* (2006.01)

(52) U.S. Cl.
CPC .............. *H10B 10/12* (2023.02); *G11C 5/063* (2013.01); *H01L 27/0924* (2013.01); *H01L 29/66795* (2013.01); *H01L 29/785* (2013.01)

(58) Field of Classification Search
CPC .. G11C 5/063; G11C 7/18; G11C 8/14; G11C 11/41; G11C 11/417; G11C 11/419; H10B 10/12; H10B 10/18; H01L 27/0924; H01L 29/66795; H01L 29/785
See application file for complete search history.

(56) References Cited

U.S. PATENT DOCUMENTS

| | | | |
|---|---|---|---|
| 9,741,452 B2* | 8/2017 | Atallah | H10B 10/12 |
| 2013/0154027 A1 | 6/2013 | Liaw | |
| 2015/0085568 A1* | 3/2015 | Gulati | G11C 8/14 |
| | | | 257/369 |
| 2015/0179653 A1* | 6/2015 | Wang | H10B 10/12 |
| | | | 257/369 |

(Continued)

FOREIGN PATENT DOCUMENTS

| | | |
|---|---|---|
| KR | 10-2015-0131914 A | 11/2015 |
| KR | 10-2017-0046064 A | 4/2017 |

(Continued)

*Primary Examiner* — Mamadou L Diallo
(74) *Attorney, Agent, or Firm* — MERCHANT & GOULD P.C.

(57) ABSTRACT

A static random access memory (SRAM) cell includes a four-contact polysilicon pitch (4Cpp) fin field effect transistor (FinFET) architecture including a first bit-cell and a second bit cell. The SRAM cell includes a first bit line and a first complementary bit line, wherein the first bit line and the first complementary bit line are shared by the first and second bit-cells of the SRAM cell. The SRAM cell includes a first word line connected to the first bit cell, and a second word line connected to the second bit cell.

20 Claims, 12 Drawing Sheets

(56) References Cited

U.S. PATENT DOCUMENTS

| | | | |
|---|---|---|---|
| 2015/0333073 A1 | 11/2015 | Chang et al. | |
| 2016/0064067 A1 | 3/2016 | Mojumder et al. | |
| 2016/0372316 A1 | 12/2016 | Yang et al. | |
| 2017/0110461 A1 | 4/2017 | Fujiwara et al. | |
| 2018/0301185 A1* | 10/2018 | Lin | G11C 11/419 |
| 2019/0108873 A1* | 4/2019 | Zang | G11C 11/418 |
| 2019/0189195 A1* | 6/2019 | Na | H01L 29/0673 |
| 2019/0385657 A1* | 12/2019 | Augustine | H10B 10/12 |
| 2020/0006429 A1* | 1/2020 | McCollum | G11C 13/0097 |
| 2020/0006430 A1* | 1/2020 | McCollum | G11C 13/0011 |
| 2020/0020699 A1 | 1/2020 | Fujiwara et al. | |

FOREIGN PATENT DOCUMENTS

| | | |
|---|---|---|
| TW | 201721810 A | 6/2017 |
| TW | 201822343 A | 6/2018 |
| WO | 2016/032645 A1 | 3/2016 |

\* cited by examiner

4CPP SRAM CELL AND ARRAY

CROSS-REFERENCE TO RELATED APPLICATION

This application is a continuation of U.S. patent application Ser. No. 16/589,806 (now U.S. Pat. No. 11,088,151), filed on Oct. 1, 2019, which is incorporated by reference in its entirety.

BACKGROUND

A common type of integrated circuit memory is a static random access memory (SRAM) device. A typical SRAM memory device has an array of memory cells, or "bit-cells". In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines. The transistors of a fin field effect transistor (FinFET) SRAM cell include an active semiconductor fin structure having source/drain (S/D) contacts connected to the fin structure on either side of a polysilicon gating structure connected to the fin. Typically, in the manufacture of a two contacted poly pitch (2Cpp) FinFET architecture, processing steps to add certain shared contacts and to cut/refine the fin structure is necessary. The first metal layer (M0) of four contacted poly pitch (4Cpp) FinFET architectures is typically congested and requires extra processing steps to correctly route the metal traces.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
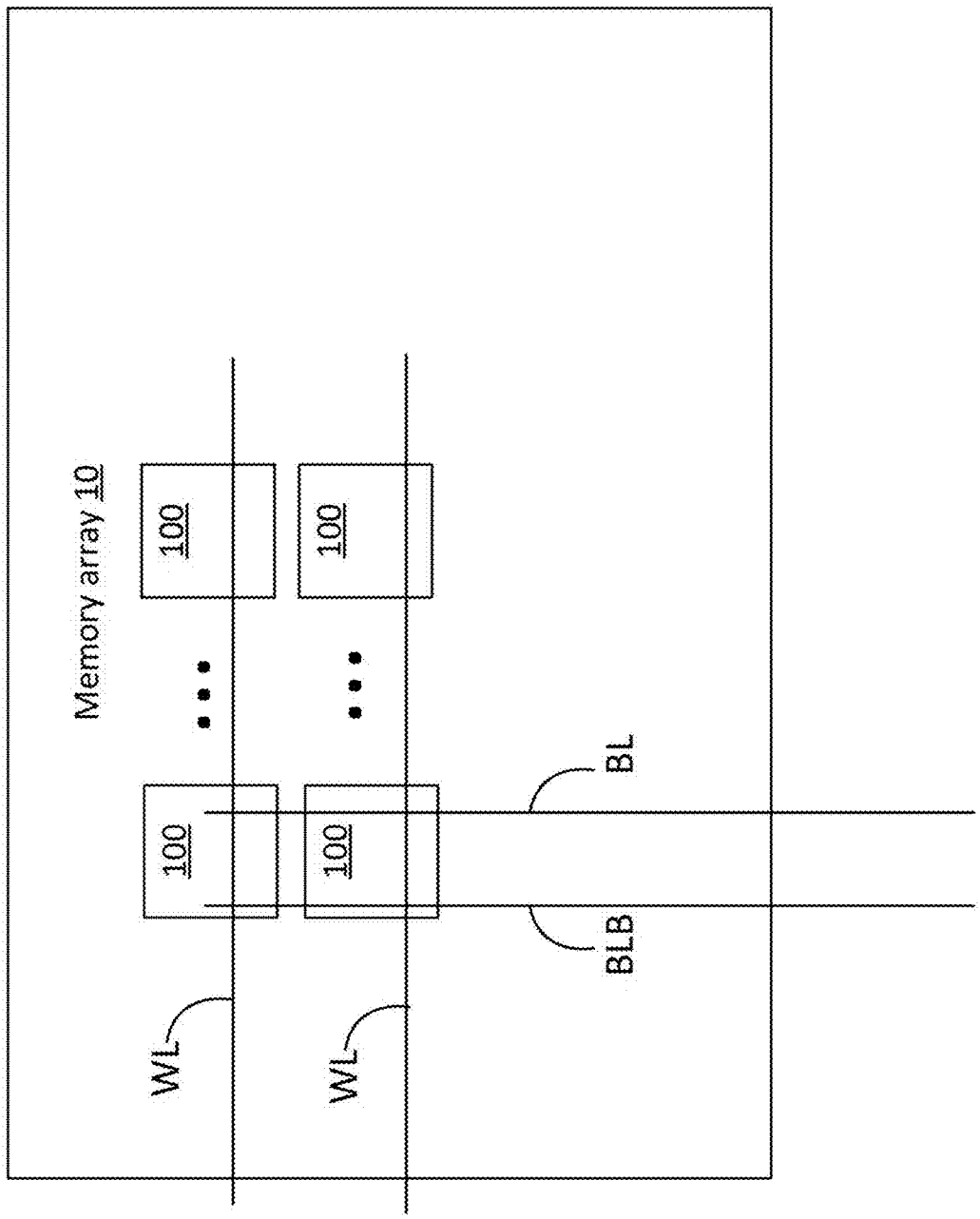
FIG. 1 is a block diagram illustrating an example of a memory array in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device has an array of memory cells that include transistors formed using a fin field effect transistor (FinFET) architecture. For example, a polysilicon structure can be connected to a semiconductor fin that extends above an isolation material. The polysilicon structure functions as the gate of the FinFET transistor such that a voltage applied to the polysilicon structure determines the flow of electrons between source/drain (S/D) contacts connected to the fin on opposite sides of the polysilicon structure. A threshold voltage of the FinFET transistor is the minimum voltage such that the transistor is considered to be turned "on" such that an appreciable current can flow between the S/D contacts. The number of polysilicon structures in contact with a fin along its length that are used in forming a SRAM cell can be considered to be the "pitch," often termed the "contacted poly pitch" or Cpp, of the SRAM cell along one dimension and is at least partially determinative of the density of the SRAM device. For example, a four contacted poly pitch (4Cpp) SRAM cell includes two pass gate transistors, two PMOS transistors, and two NMOS transistors all formed using a number of fins, the fins having four polysilicon structures connected to the fin along its length and having a S/D contact connected to the fin between at least some of the polysilicon structures.

In the manufacture of typical 2Cpp FinFET SRAM architectures, a process step requiring a cut of a portion of the fins in each cell is necessary to form a 6T SRAM cell. In addition, an additional processing step after forming the first set of contacts of each of the cells in the array is needed to form certain shared contacts connecting the gates of the first pair of pull up/pull down transistors forming the first inverter of the memory cell to the sources/drains of the second pair of transistors forming the second inverter of the memory cell so as to form the cross-coupled 6T cell. These shared contacts require a subsequent processing step because they connect cell components, e.g. fins, poly, and contacts, in the orthogonal direction from the source/drain contacts.

An alternative FinFET SRAM architecture is a 4Cpp architecture, which does not require a cut of a portion of the fins in each cell and does not need a shared contact requiring a subsequent processing step. However, typical 4Cpp architectures result in a congested metal layer design, for example, the bit line and complementary bit line run in the same track and require routing design solutions and extra processing steps to implement those solutions in the metal layers.

In some embodiments disclosed herein, a 4Cpp FinFET SRAM architecture is provided that does not require a cut of a portion of the fins in each cell, does not need a shared contact, and simplifies the metal layer routing is presented. In some embodiments, a 4Cpp cell is comprised of two 4Cpp bit cells that share a bit line and a complementary bit line.

FIG. 1 is a block diagram illustrating an example of a memory array 10 in accordance with some embodiments. FIG. 1 shows a memory array 10 with a plurality of memory cells 100, or bit-cells 100. One or more peripheral circuits (not shown) may be located at one or more regions peripheral to, or within, the memory array 10. The memory cell 100 and the periphery circuits may be coupled by complementary bit lines BL and BLB, and data can read from and written to the memory cells 100 via the complementary bit lines BL and BLB.

Figure 2:
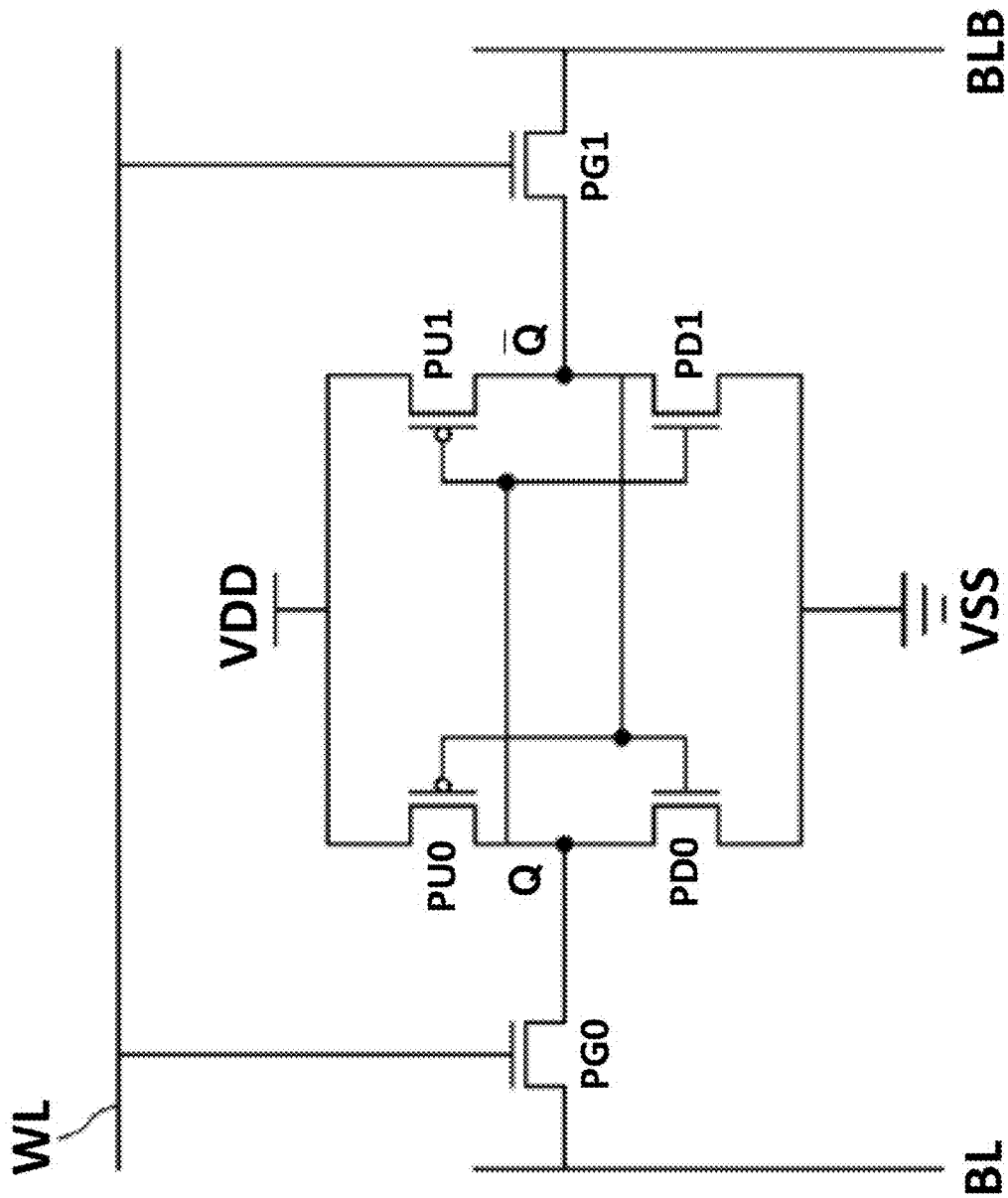
FIG. 2 is a circuit diagram illustrating an example 6T memory cell in accordance with some embodiments.

FIG. 2 is a circuit diagram illustrating an example memory cell 100 in accordance with some embodiments. The memory cell 100 includes but is not limited to a six-transistor (6T) SRAM structure. In some embodiments more or fewer than six transistors may be used to implement the memory cell 100. For example, the memory cell 100 in some embodiments may use a 4T, 8T or 10T SRAM structure, and in other embodiments may include a memory-like bit-cell or a building unit. The memory cell 100 includes a first inverter formed by a NMOS/PMOS transistor pair PU0 and PD0, e.g. pull-up 0 and pull-down 0. The memory cell 100 also includes a second inverter formed by a NMOS/PMOS transistor pair PU1 and PD1, and access transistors/pass gates PG0 and PG1. Transistors PD0, PD1, PG0 and PG1 include n-type metal-oxide-semiconductor (NMOS) transistors, and transistors PU0 and PU1 include p-type metal-oxide semiconductor (PMOS) transistors.

Power is supplied to each of the inverters, for example, a first terminal of each of transistors PU0 and PU1 is coupled to a power supply VDD, while a first terminal of each of transistors PD0 and PD1 is coupled to a reference Voltage VSS, for example, ground. A bit of data is stored in the memory cell 100 as a voltage level at the node Q, and can be read by circuitry via the bit line BL. Access to the node Q is controlled by the pass gate transistor PG0. The node Qbar stores the complement to value at Q, e.g. if Q is "high," Qbar will be "low," and access to Qbar is controlled by the pass gate transistor PG1.

A gate of the pass gate transistor PG0 is coupled to a word line WL. A first source/drain (S/D) terminal of the pass gate transistor PG0 is coupled to a bit line BL, and a second S/D terminal of the pass gate transistor PG0 is coupled to the second terminals of transistors PU1 and PD1 at the node Q.

Similarly, a gate of the pass gate transistor PG1 is coupled to the word line WL. A first S/D terminal of the pass gate transistor PG1 is coupled to a complementary bit line BLB, and a second S/D first terminal of the pass gate transistor PG1 is coupled to second terminals of transistors PU0 and PU1 at the node Qbar.

Figure 3:
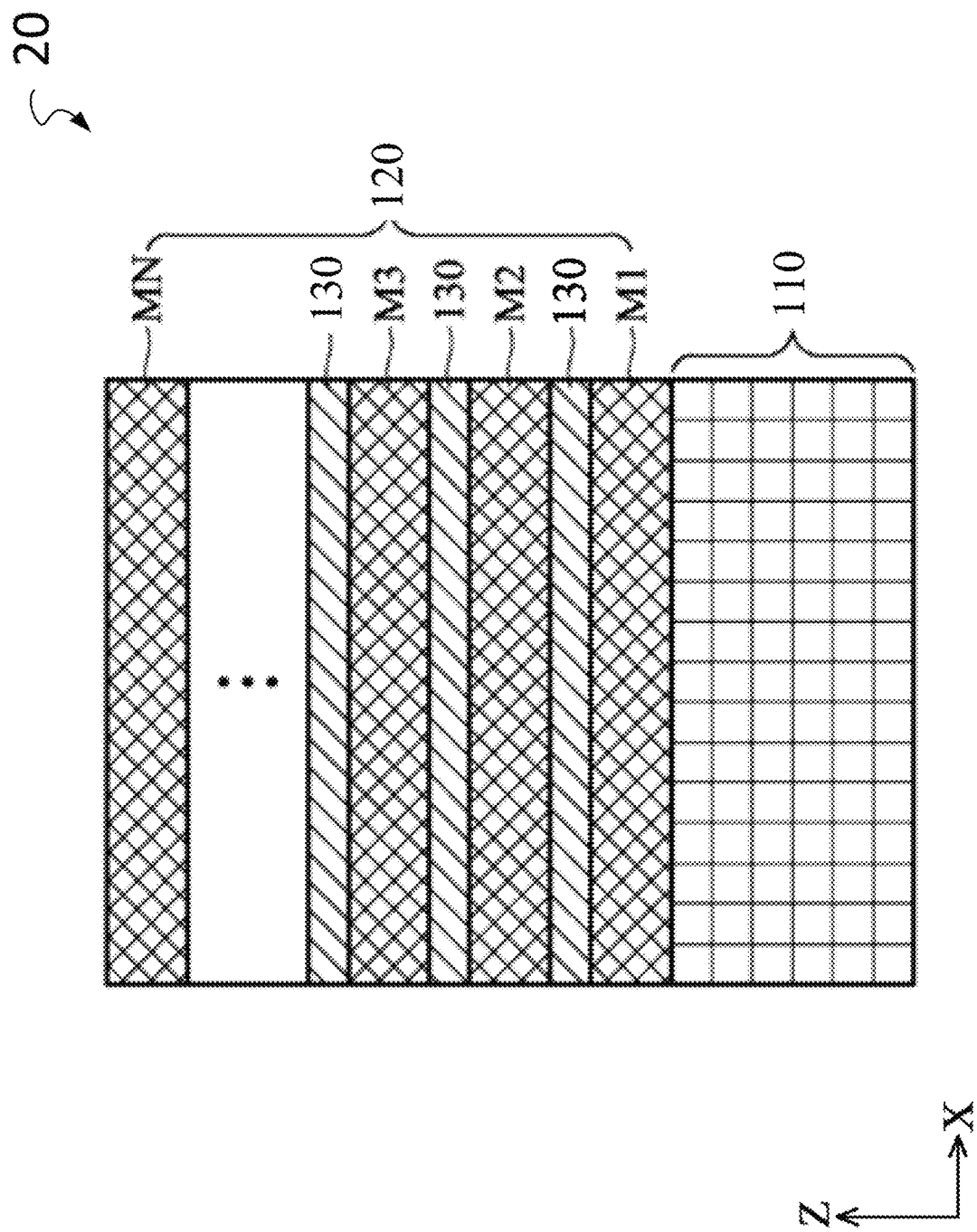
FIG. 3 is a block diagram illustrating a cross-section of an example semiconductor structure in accordance with some embodiments.

FIG. 3 is a block diagram illustrating a cross-section of an example semiconductor structure in accordance with some embodiments. The structure 20 is shown in the X-axis and Z-axis directions while the Y-axis direction is orthogonal to the plane of the cross-section illustrated in FIG. 3. The structure 20 includes a base layer 110 and an interconnect layer 120.

Generally, the base layer 110 includes a semiconductor substrate that, in turn, includes polysilicon regions (e.g. also termed "poly" throughout this disclosure), diffusion regions, semiconductor wells (e.g., N-wells, P-wells, deep N-wells, deep P-wells), etc., wherein semiconductor devices (e.g., transistors, diodes, etc.) are formed. An interconnect layer 120 includes N (e.g., an integer number of) conductive layers (e.g., metal layers M1 to MN) used for interconnecting devices within layers in interconnect layer 120 and for forming electrical connections to external devices, etc. The interconnect layer 120 generally includes vias, inter-level dielectric materials, passivation layers, bonding pads, packaging resources, etc. Each metal (e.g., conductive) layer M in the interconnect layer 120 is commonly called metal one, metal two, metal three (M1, M2, M3, etc) layers, etc. Between the various metal layers M are dielectric materials (e.g., high-K, low-K material, etc.) 130 used to insulate the metal layers M. The base layer 110 and interconnect layer 120 are often called a front-end structure and a backend structure, respectively, because they are the respective "front end of line" (FEOL) and "back end of line" (BEOL) in the semiconductor fabrication process. In some embodiments, memory or storage elements including memory cells, latches and flip-flops are built using base layer 110 and one or more of the metal layers M.

Figure 4:
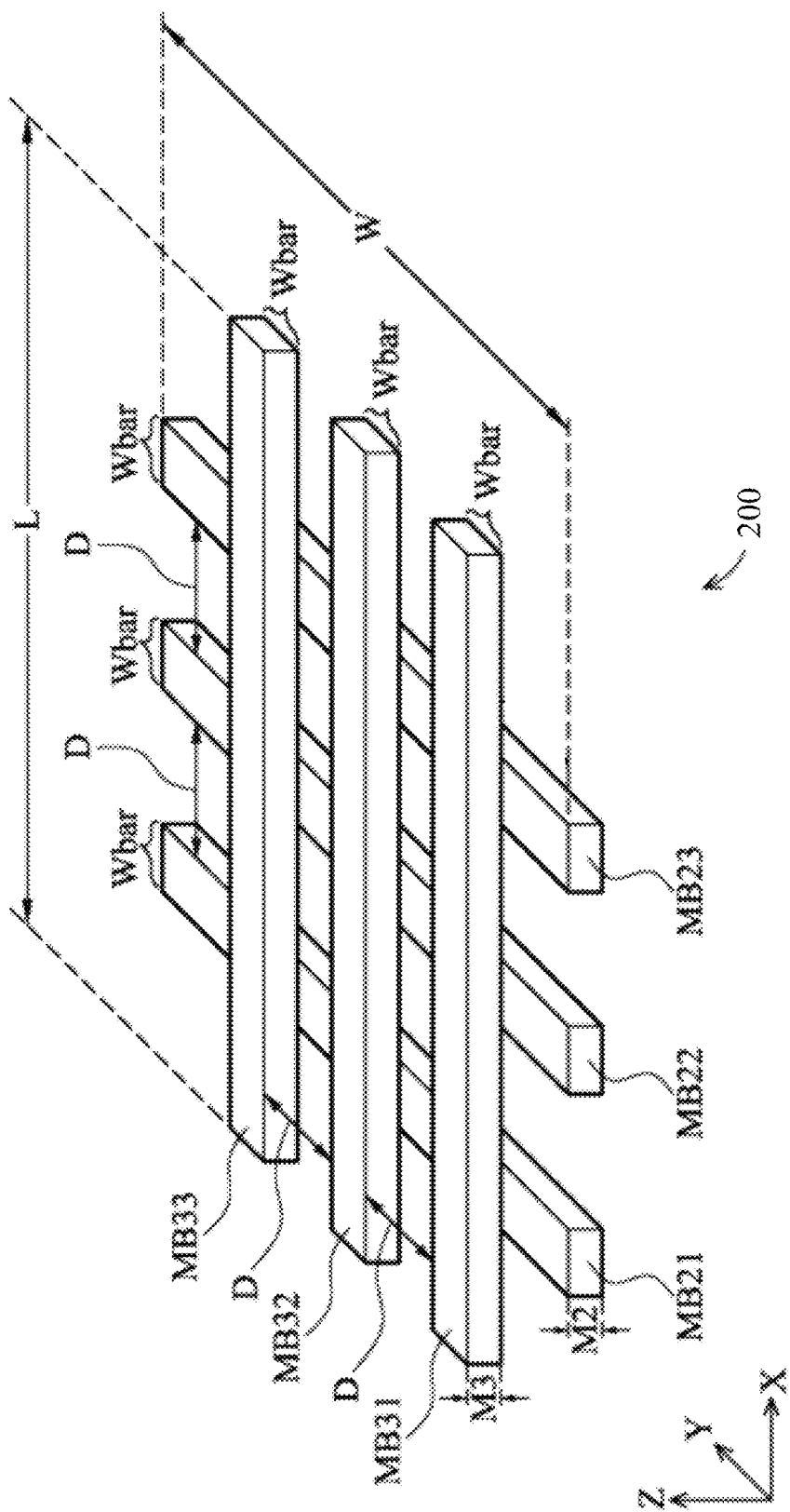
FIG. 4 is a block diagram illustrating an example interconnect metal layer structure in accordance with some embodiments.

FIG. 4 is a block diagram illustrating an example interconnect metal layer structure 200 in accordance with some embodiments. The metal layer structure 200 includes a plurality of conductive layers M (e.g., M1, M2, M3, etc.). In the embodiment shown, the metal layer structure 200 illustrates only two layers (e.g., M2 and M3), and the embodiment shown in FIG. 5 and described further below illustrates a cross-section view of the metal layer structure 200 having four layers (e.g., M1, M2, M3, and M4). The number of layers shown in FIGS. 4 and 5 are for illustration, and metal layer structures 200 having different numbers of layers, e.g., from 1 to N layers, are within the scope of the disclosed embodiments.

In the embodiment shown in FIG. 4, each metal layer M includes a plurality of metal bars MB, for example, metal bars MB21, MB22, and MB23 in layer M2 and metal bars MB31, MB32, MB33 in layer M3. In some embodiments, the shape of the metal bars is cylindrical or some other shape, and can be any cross-sectional shape. In the embodiment shown, each of the metal bars MB in a layer M are substantially parallel to one another. In the embodiment shown, each metal layer M2 and M3 includes three metal bars MB, however, configurations having different numbers of metal bars MB per metal layer M are within the scope of the disclosed embodiments. In some embodiments, a first set of metal bars MB (e.g., metal bars MB in metal layers M1, M3, M5, etc.) run in a first direction (e.g., X-axis direction) while a second set of metal bars MB (e.g., in metal layers M2, M4, M6, etc.) run in a second direction (e.g., Y-axis direction) wherein the X-axis direction is perpendicular to the Y-axis direction. Different configurations wherein all bars MB run in one direction, e.g., X-axis direction, Y-axis direction, or any other convenient direction, or a combination of directions, including non-perpendicular directions, are within the scope of the disclosed embodiments. In the embodiment shown in FIG. 4, each metal bar MB has a width Wbar. In some embodiments, all widths Wbar are of the same dimension, but the disclosed embodiments are not limited to such a configuration. Depending on design choices, the widths Wbar may be of different dimensions (e.g., one width Wbar may be shorter/larger than another one). Two adjacent metal bars MB are spaced or separated by a distance, e.g., distance D. In some embodiments, distances D are selected to meet the minimum requirements of spacing between two metal bars MB to form capacitance between those two bars. In some embodiments, all distances D in the metal layer structure 200 are of the same dimension, but the disclosed embodiments are not limited to such a configuration. That is, distances D may be of different dimensions (e.g., one distance D may be shorter/longer than another one). The thickness of a metal bar MB in a layer M is proportional to the layer M thickness, which can be process technology dependent, and different groups of layers M can have different thicknesses. For example, a first group of metal layers M (e.g., Mx) can have a first thickness, a second group of metal layer M (e.g., My) can have a second thickness, and a third group of metal layers (e.g., Mz) can have a third thickness, etc, wherein the first, the second, and the third thickness are different. In the embodiment shown, the metal layer structure 200 has a width W and a length L.

Figure 5:
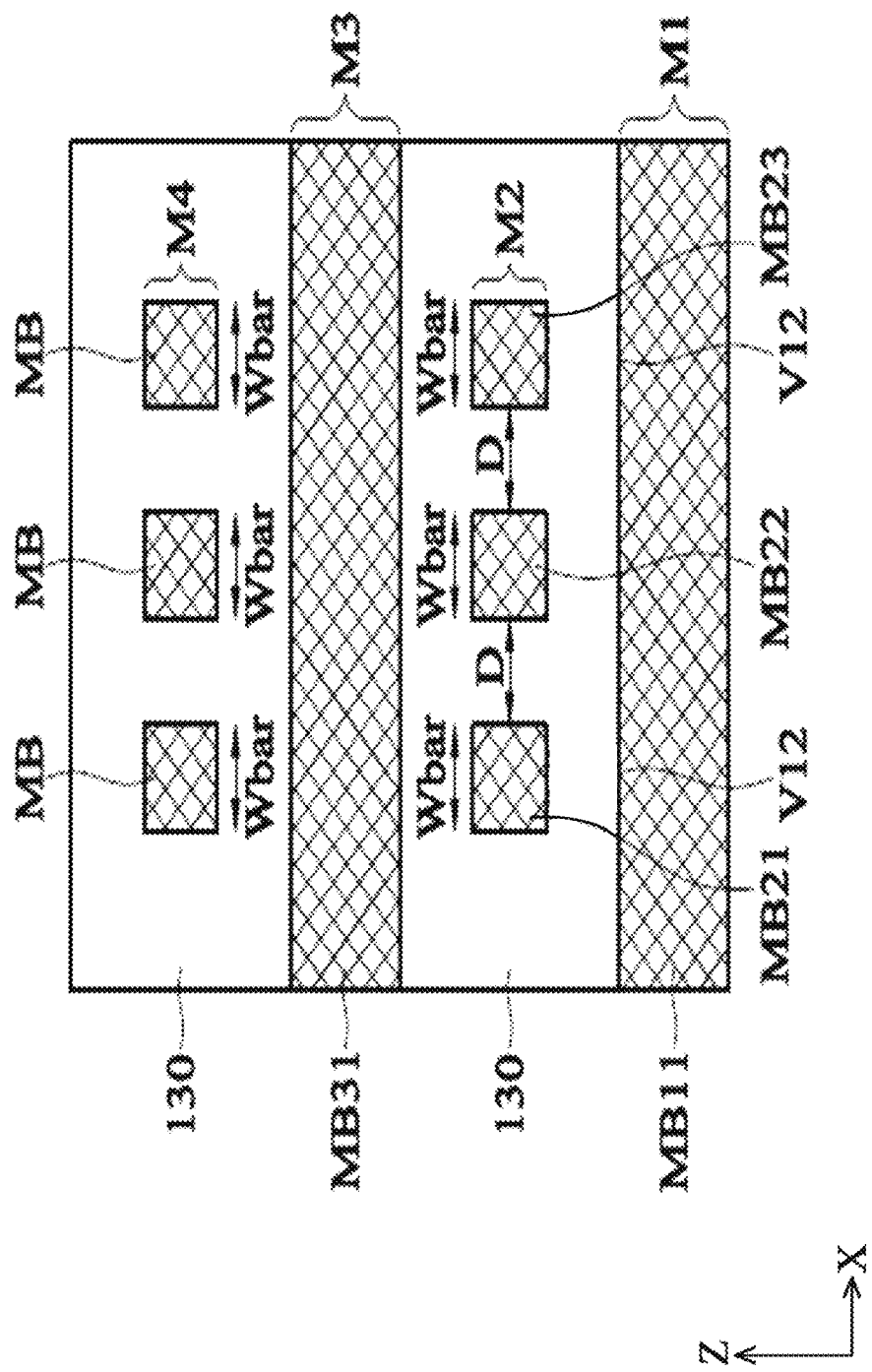
FIG. 5 is a block diagram illustrating a cross-section of an example interconnect metal layer structure in accordance with some embodiments.

FIG. 5 is a block diagram illustrating a cross-section of an example interconnect metal layer structure 200 in accordance with some embodiments. In the embodiment shown, the metal layer structure 200 includes metal layers M1 and M3 having metal bars MB, e.g. metal traces, wires, conductors, etc., oriented parallel to the X-axis and metal layers M2 and M4 having metal bars MB oriented parallel to the Y-axis and orthogonal to the M1 and M3 metal bars. In the embodiment shown, the metal layers M are separated by the dielectric material 130.

Figure 6:
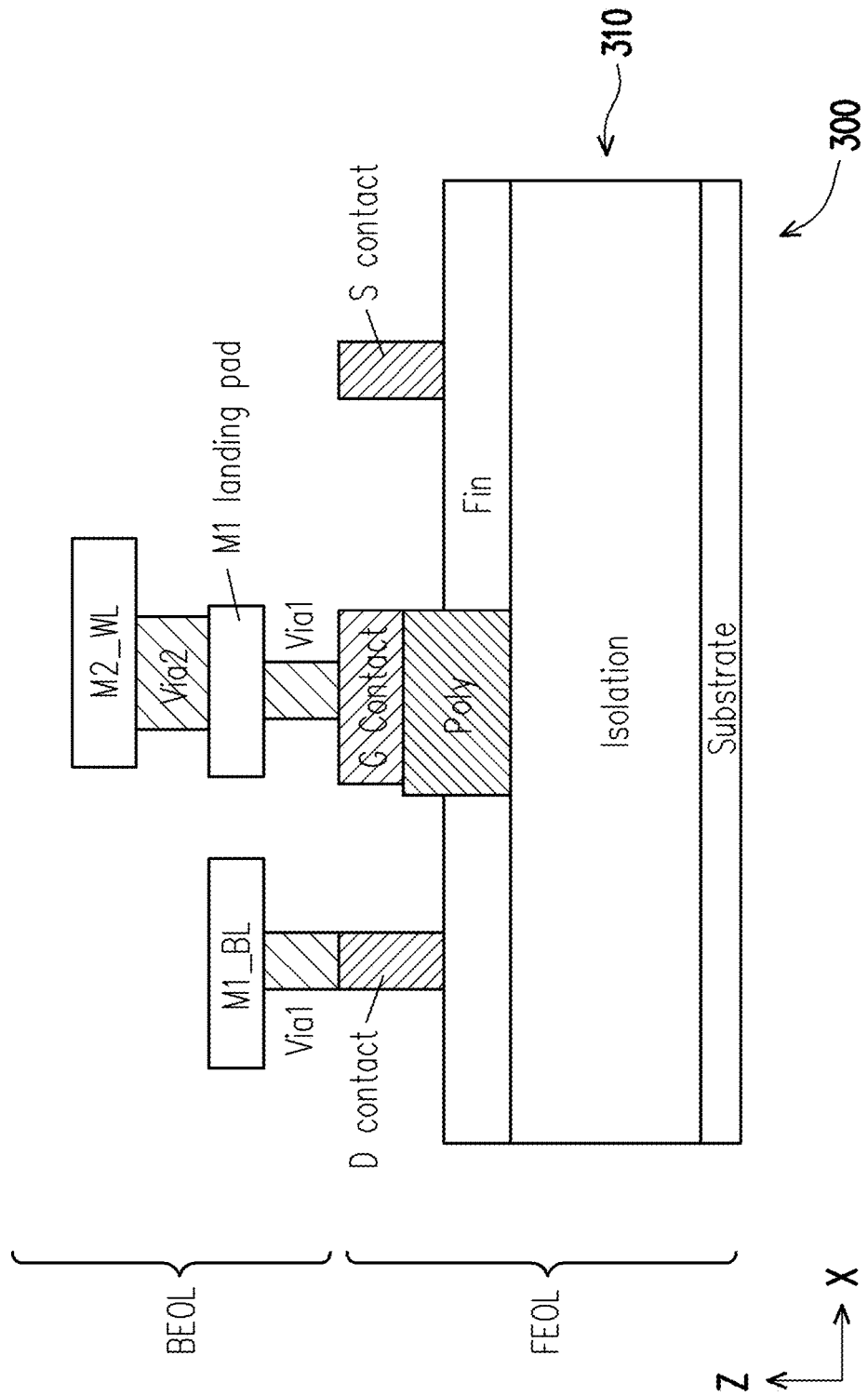
FIG. 6 is a block diagram illustrating a cross-section of an example semiconductor structure in accordance with some embodiments.

FIG. 6 is a block diagram illustrating a cross-section of an example semiconductor structure 300 in accordance with some embodiments. The embodiment shown includes a FEOL layer including semiconductor structures and a BEOL layer including interconnect metal layer structures.

In the embodiment shown, the FEOL layer illustrates a pass gate FinFET transistor 310. The FinFET transistor 310 includes a semiconductor substrate, a fin, an isolation region, a polysilicon structure, e.g. poly, the conductive contacts S and D connected to the fin, and the conductive G contact connected to the polysilicon structure. In the embodiment shown, the conduction path for current is the fin (the fin can also be referred to as the diffusion region or oxide diffusion region). The polysilicon structure functions as a gate allowing current flow in the fin from the S (e.g. source) contact to the D (e.g. drain) contact. For example, for a voltage potential between the S and D contacts, current can flow in the fin from S to D depending on a voltage applied to the polysilicon structure. If a voltage less than a threshold voltage is applied to the poly, then appreciable current cannot flow in the fin from the S to the D contacts, and the transistor 310 is "off." If a voltage greater than or equal to the threshold voltage is applied to the poly, appreciable current flows from S to D via the fin and the transistor 310 is "on." In some embodiments, the S, D, and G contacts form connections between multiple fins and polysilicon structures in the FEOL layer, thereby connecting the sources, drains, and gates of one or more transistors. In some embodiments, the sources, drains, and gates of the transistor 310 are connected to an interconnect metal layer structure in the BEOL layer. For example, typically the gates of the transistor 310 is connected to a word line, the word line being one of the metal bars in one of the layers of the interconnect metal structure in the BEOL layer, and the S/D contacts of pass gate transistors 310 will similarly be connected to the complementary bit lines BL and BLB, the complementary bit lines BL and BLB being other ones of the metal bars in one or more of the metal layers in the BEOL layer. In some embodiments, the BEOL layer serves to connect the transistor 310 to peripheral circuits, for example for read/write operations. In the embodiment shown, the D, and G contacts connect to the metal bars in the BEOL layer using vias. For example, Via1 forms a connection between the D contact to a metal bar, e.g. a bit line, in the first metal layer M1 above the FEOL layer. In the embodiment shown, a separate Via1 connects the G contact to a conductive landing pad in the M1 layer, and Via2 connects the conductive landing pad to a metal bar, e.g. the word line, in the M2 layer. In some embodiments, the conductive landing pad in the M1 layer can be formed from a metal bar that has been cut, or disconnected, in the plane of its metal layer. For example, the conductive landing pad can be formed from a metal bar such as the metal bar MB11 illustrated in FIG. 5, where MB11 has been cut or disconnected along its length in the X-axis direction in positions corresponding to D on either side of the MB22 metal bar in the metal layer above it, forming a conductively isolated short metal bar, or pad.

Figure 7:
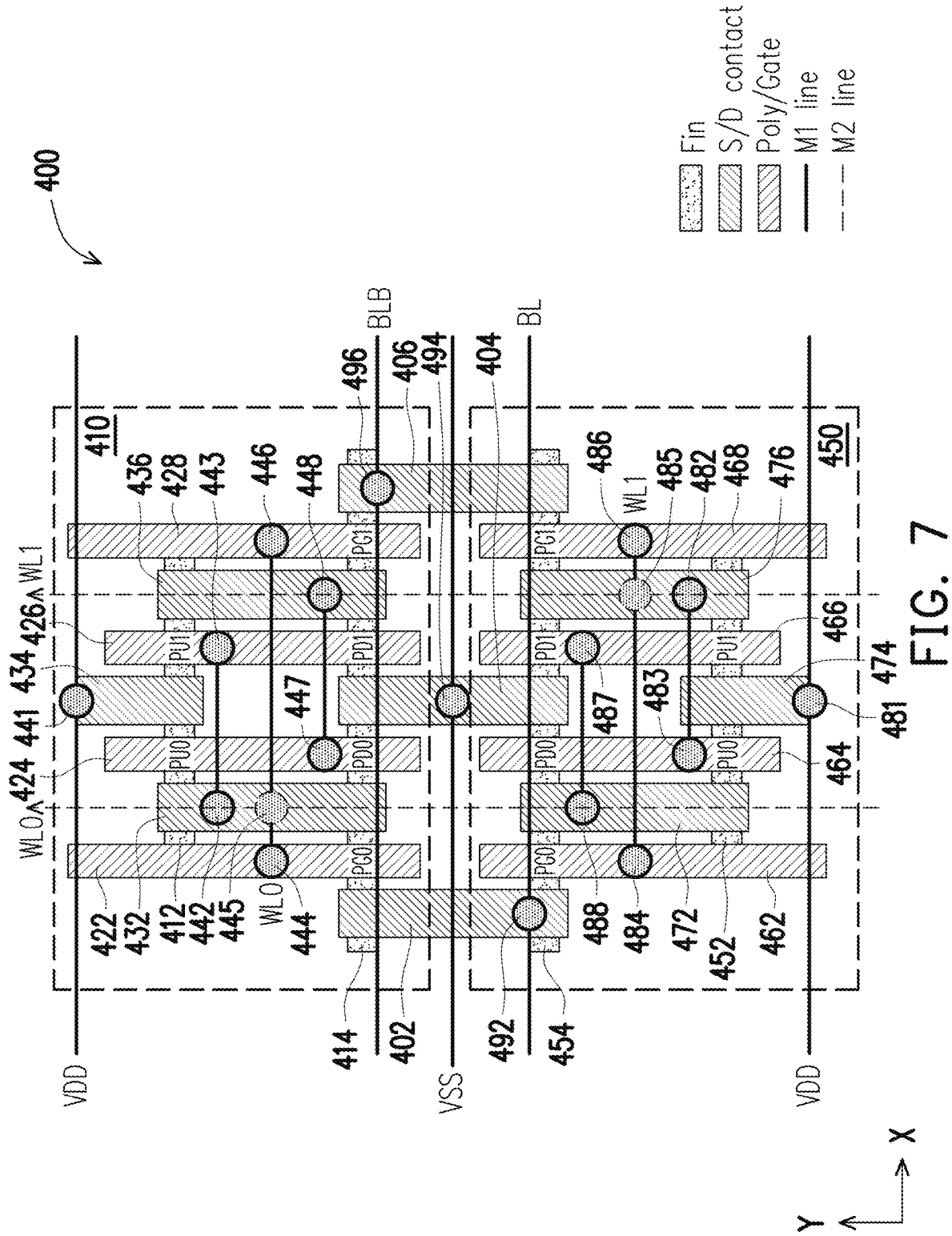
FIG. 7 is a layout diagram illustrating an example 4Cpp FinFET SRAM cell unit in accordance with some embodiments.

FIG. 7 is a layout diagram illustrating an example 4Cpp FinFET SRAM cell unit 400 in accordance with some embodiments. The 4Cpp FinFET SRAM cell unit 400 includes a first 4Cpp memory bit cell, e.g. the bit cell 410, and a second bit cell 450. The embodiment illustrated in FIG. 7 also includes metal lines in a first metal layer, e.g. M1 as illustrated in FIG. 5, and metal lines in a second metal layer, e.g. M2 as illustrated in FIG. 5. In the embodiment shown, each of the first bit cell 410 and the second bit cell 450 form a 6T SRAM memory cell, for example, the memory cell 100 illustrated and described above in relation to FIG. 2, including the transistors PG0, PU0, PD0, PG1, PU1, and PD1.

In the embodiment shown, the first bit cell 410 includes fins 412 and 414, polysilicon structures 422, 424, 426, and 428, and S/D contacts 432, 434, and 436. The first bit cell 410 also includes the vias 441-448 connecting components of the first bit cell 410 in the FEOL layer to conductive lines or traces, e.g. metal bars, in the BEOL layer. In the embodiment shown, the fins 412 and 414 have a longer dimension (e.g. a length) along a first direction, for example the X-axis direction as shown in FIG. 7, and are separated from each other in a second direction, for example the Y-axis direction. The polysilicon structures 422-428 and the S/D contacts 432-436 have a longer dimension (e.g. a length) along the second direction, for example the Y-axis direction as shown in FIG. 7, and are separated from each other in the first direction, e.g. the X-axis direction. In some embodiments, the length of the fins, poly, and S/D contacts have lengths that are not their longest dimensions, for example, the fins, poly, and S/D contacts can have a square, elliptical, circular, or any other shape.

In the embodiment shown, power is supplied on the VDD lines in the first metal layer M1, and is connected to the S/D contact 434 of both PU0 and PU1 of the first bit cell 410 by the via 441. The S/D contact 434 is connected to the fin 412 beside, but not in contact with, the polysilicon structure 424. The poly 424 is also connected to the fin 412. The S/D contact 432 is connected to the fin 412 on the opposite side of the poly 424 from the S/D contact 434, e.g. in the negative X-axis direction, and beside, but not in contact with, the poly 424. The S/D contact 434, fin 412, poly 424, and S/D contact 432 form the PU0 transistor, with S/D contacts 434 and 432 as the sources and drains and the poly 424 as the gate. The PU1 transistor is formed by the S/D contacts 434, 436 and the poly 426 all connected to the fin 412, with the S/D contact 436 beside, but not in contact with, the poly 426 and on the opposite side of the poly 426 from the S/D contact 434.

In the embodiment shown, the S/D contacts 432 and 436 extend from the fin 412 in the second direction, e.g. in the negative Y-axis, and connect to the fin 414. The polysilicon structures 424 and 426 similarly extend in the second direction and connect to the fin 414. In the embodiment shown, the second direction is generally orthogonal to the first direction, and the S/D contacts 432, 436 and polys 424 and 426 repeat their placements on the fin 414 as that of fin 412, namely, S/D contact 432, poly 424, poly 426, and S/D contact 436 in the positive X-axis direction. In the embodiment shown, the S/D contact 404 is connected to the fin 414 between the poly 424 and the poly 426, and is connected to VSS in the M1 metal layer by the via 494. The S/D contact 432, fin 414, poly 424, and S/D contact 404 form the PD0 transistor, with S/D contacts 432 and 404 as the sources and drains and the poly 424 as the gate. Similarly, along the fin 414 in the positive X-axis direction, the PD1 transistor is formed by the S/D contact 404, poly 426, and S/D contact 436, all of which are connected to the fin 414. In the embodiment shown, the PD0 and PD1 transistors share the S/D contact 404 and are thereby connected to the reference voltage VSS in the M1 layer, e.g. ground. The poly 424 is the gate for both the PU0 and the PD0 transistors, and as such the gates of the PU0 and PD0 transistors are connected as illustrated in FIG. 2. Similarly, the poly 426 is the gate for both the PU1 and the PD1 transistors, and as such the gates of the PU1 and PD1 transistors are connected as illustrated in FIG. 2.

In the embodiment shown, a poly 422 is connected to the fin 414 between S/D contacts 432 and 402, each of which are also connected to the fin 414, forming the pass gate transistor PG0. The S/D contact 402 is connected to the bit line BL in the M1 metal layer by the via 492, thereby connecting a source/drain terminal of the transistor PG0 to the bit line BL. Similarly, the poly 428 is connected to the fin 414 between S/D contacts 436 and 406, each of which are also connected to the fin 414, forming the pass gate transistor PG1. The S/D contact 406 is connected to the complementary bit line BLB in the M1 metal layer by the via 496, thereby connecting a source/drain terminal of the transistor PG1 to the complementary bit line BLB.

In the embodiment shown, the poly 426 is connected to the S/D contact 432 by a conductive line in the M1 layer. This connection is made in the example shown by the poly 426 being connected to the conductive line in the M1 layer by the via 443 and the S/D contact 432 being connected to the conductive line in the M1 layer by the via 442. As such, the gates of the PU1 and PD1 transistors are connected to a S/D terminal of each of the PU0, PD0, and PG0 transistors at the node Q, as illustrated in FIG. 2. Similarly, the poly 424 is connected to the S/D contact 436 by a conductive line in the M1 layer. This connection is made in the example shown by the poly 424 being connected to the conductive line in the M1 layer by the via 447 and the S/D contact 436 being connected to the conductive line in the M1 layer by the via 448. As such, the gates of the PU0 and PD0 transistors are connected to a S/D terminal of each of the PU1, PD1, and PG1 transistors at the complementary node Qbar, as illustrated in FIG. 2.

In the embodiment shown, the poly 422 and the poly 428, e.g. the gates of the PG0 and PG1 transistors, are connected by a conductive line in the M1 layer. This connection is made in the example shown by the poly 422 being connected to the conductive line in the M1 layer by the via 444 and the poly 428 being connected to the conductive line in the M1 layer by the via 446. The conductive line in the M1 layer is connected to a conductive line in the M2 layer, e.g. the word line WL0, by the via 445. As such, in the embodiment shown, both the gates of the PG0 and PG1 transistors are connected to the word line WL0 as illustrated in FIG. 2. In the embodiment shown, the conductive line in the first metal layer M1 that connects the gates of PG0 and PG1 has a length dimension orthogonal to that of the conductive line in the second metal layer M2, e.g. the word line WL0.

In the embodiment shown, the second bit cell 450 includes fins 452 and 454, polysilicon structures 462, 464, 466, and 468, and S/D contacts 472, 474, and 476. The second bit cell 450 also includes the vias 481-488 connecting components of the second bit cell 450 in the FEOL layer to conductive lines or traces, e.g. metal bars, in the BEOL layer. In the embodiment shown, the fins 452 and 454 have a longer dimension (e.g. a length) along a first direction, for example the X-axis direction as shown in FIG. 7, and are separated from each other in a second direction, for example the Y-axis direction. The polysilicon structures 462-468 and the S/D contacts 472-476 have a longer dimension (e.g. a length) along the second direction, for example the Y-axis direction as shown in FIG. 7, and are separated from each other in the first direction, e.g. the X-axis direction. In some embodiments, the length of the fins, poly, and S/D contacts have lengths that are not their longest dimensions, for example, the fins, poly, and S/D contacts can have a square, elliptical, circular, or any other shape.

In the embodiment shown, power is supplied on the VDD lines in the first metal layer M1, and is connected to the S/D contact 474 of both PU0 and PU1 of the second bit cell 450 by the via 481. The S/D contact 474 is connected to the fin 452 beside, but not in contact with, the polysilicon structure 464. The poly 464 is also connected to the fin 452. The S/D contact 472 is connected to the fin 452 on the opposite side of the poly 464 from the S/D contact 474, e.g. in the negative X-axis direction, and beside, but not in contact with, the poly 464. The S/D contact 474, fin 452, poly 464, and S/D contact 472 form the PU0 transistor, with S/D contacts 474 and 472 as the sources and drains and the poly 464 as the gate. The PU1 transistor is formed by the S/D contacts 474, 476 and the poly 466 all connected to the fin 452, with the S/D contact 476 beside, but not in contact with, the poly 466 and on the opposite side of the poly 466 from the S/D contact 474.

In the embodiment shown, the S/D contacts 472 and 476 extend from the fin 452 in the second direction, e.g. in the positive Y-axis, and connect to the fin 454. The polysilicon structures 464 and 466 similarly extend in the second direction and connect to the fin 454. In the embodiment shown, the second direction is generally orthogonal to the first direction, and the S/D contacts 472, 476 and polys 464 and 466 repeat their placements on the fin 454 as that of fin 452, namely, S/D contact 472, poly 464, poly 466, and S/D contact 476 in the positive X-axis direction. In the embodiment shown, the S/D contact 404 extends from the fin 414 in the negative Y-axis direction and is connected to the fin 454 between the poly 464 and the poly 466, and is connected to VSS in the M1 metal layer by the via 494 as described above. As such, the first bit cell 410 and the second bit cell "share" the S/D contact 404. The S/D contact 472, fin 454, poly 464, and S/D contact 404 form the PD0 transistor, with S/D contacts 472 and 404 as the sources and drains and the poly 464 as the gate. Similarly, along the fin 454 in the positive X-axis direction, the PD1 transistor is formed by the S/D contact 404, poly 466, and S/D contact 476, all of which are connected to the fin 454. In the embodiment shown, the PD0 and PD1 transistors share the S/D contact 404 and are thereby connected to the reference voltage VSS in the M1 layer, e.g. ground. The poly 464 is the gate for both the PU0 and the PD0 transistors, and as such the gates of the PU0 and PD0 transistors are connected as illustrated in FIG. 2. Similarly, the poly 466 is the gate for both the PU1 and the PD1 transistors, and as such the gates of the PU1 and PD1 transistors are connected as illustrated in FIG. 2.

In the embodiment shown, a poly 462 is connected to the fin 454 between S/D contacts 472 and 402, each of which are also connected to the fin 454, forming the pass gate transistor PG0. In the embodiment shown, the S/D contact 402 extends from the fin 414 in the negative Y-axis direction and is connected to the fin 454, and is connected to the bit line BL in the M1 metal layer by the via 492 as described above, thereby connecting a source/drain terminal of the transistor PG0 to the bit line BL. As such, the first bit cell 410 and the second bit cell "share" the S/D contact 402, and also share the bit line BL. Similarly, the poly 468 is connected to the fin 454 between S/D contacts 476 and 406, each of which are also connected to the fin 414, forming the pass gate transistor PG1. In the embodiment shown, the S/D contact 406 extends from the fin 414 in the negative Y-axis direction and is connected to the fin 454, and is connected to the complementary bit line BLB in the M1 metal layer by the via 496 as described above, thereby connecting a source/drain terminal of the transistor PG1 to the complementary bit line BLB. As such, the first bit cell 410 and the second bit cell "share" the S/D contact 406, and also share the complementary bit line BLB.

In the embodiment shown, the poly 464 is connected to the S/D contact 476 by a conductive line in the M1 layer. This connection is made in the example shown by the poly 464 being connected to the conductive line in the M1 layer by the via 483 and the S/D contact 476 being connected to the conductive line in the M1 layer by the via 482. As such, the gates of the PU0 and PD0 transistors are connected to a S/D terminal of each of the PU1, PD1, and PG1 transistors at the node Qbar, as illustrated in FIG. 2. Similarly, the poly 466 is connected to the S/D contact 472 by a conductive line in the M1 layer. This connection is made in the example shown by the poly 466 being connected to the conductive line in the M1 layer by the via 487 and the S/D contact 472 being connected to the conductive line in the M1 layer by the via 488. As such, the gates of the PU1 and PD1 transistors are connected to a S/D terminal of each of the PU0, PD0, and PG0 transistors at the complementary node Q, as illustrated in FIG. 2.

In the embodiment shown, the poly 462 and the poly 468, e.g. the gates of the PG0 and PG1 transistors, are connected by a conductive line in the M1 layer. This connection is made in the example shown by the poly 462 being connected to the conductive line in the M1 layer by the via 484 and the poly 468 being connected to the conductive line in the M1 layer by the via 486. The conductive line in the M1 layer is connected to a conductive line in the M2 layer, e.g. the word line WL0, by the via 485. As such, in the embodiment shown, both the gates of the PG0 and PG1 transistors are connected to the word line WL1. In the embodiment shown, the conductive line in the first metal layer M1 that connects the gates of PG0 and PG1 has a length dimension orthogonal to that of the conductive line in the second metal layer M2, e.g. the word line WL1.

As described above, in the example shown in FIG. 7 the S/D contacts 402, 404, and 406 are shared between the first bit cell 420 and the second bit cell 450 of the 4Cpp FinFET SRAM cell unit 400. As such, the S/D contacts 402, 404, and 406 can be regarded as being both part of the first bit cell 410 and the second bit cell 450. In some embodiments, extra or subsequent processing steps are not required to form the shared S/D contacts 402, 404, and 406.

In the example shown in FIG. 7, the bit line BL and the complementary bit line BLB are in different "tracks," e.g. different lines in the same metal layer M1, reducing congestion in the BEOL metal layers. For example, in some embodiments the bit line BL corresponds to the metal bar MB11 and the complementary bit line BLB corresponds to the metal bar MB21, in the nomenclature of the illustrations shown in FIGS. 4 and 5. In some embodiments, the 4Cpp FinFET SRAM cell unit 400 does not require a cut of a fin structure or region. In some embodiments, the 4Cpp FinFET SRAM cell unit 400 does not need certain shared contacts, for example shared contacts that require a subsequent processing step because they connect cell components, e.g. fins, poly, and S/D contacts, in the orthogonal direction from the source/drain contacts.

Figure 8:
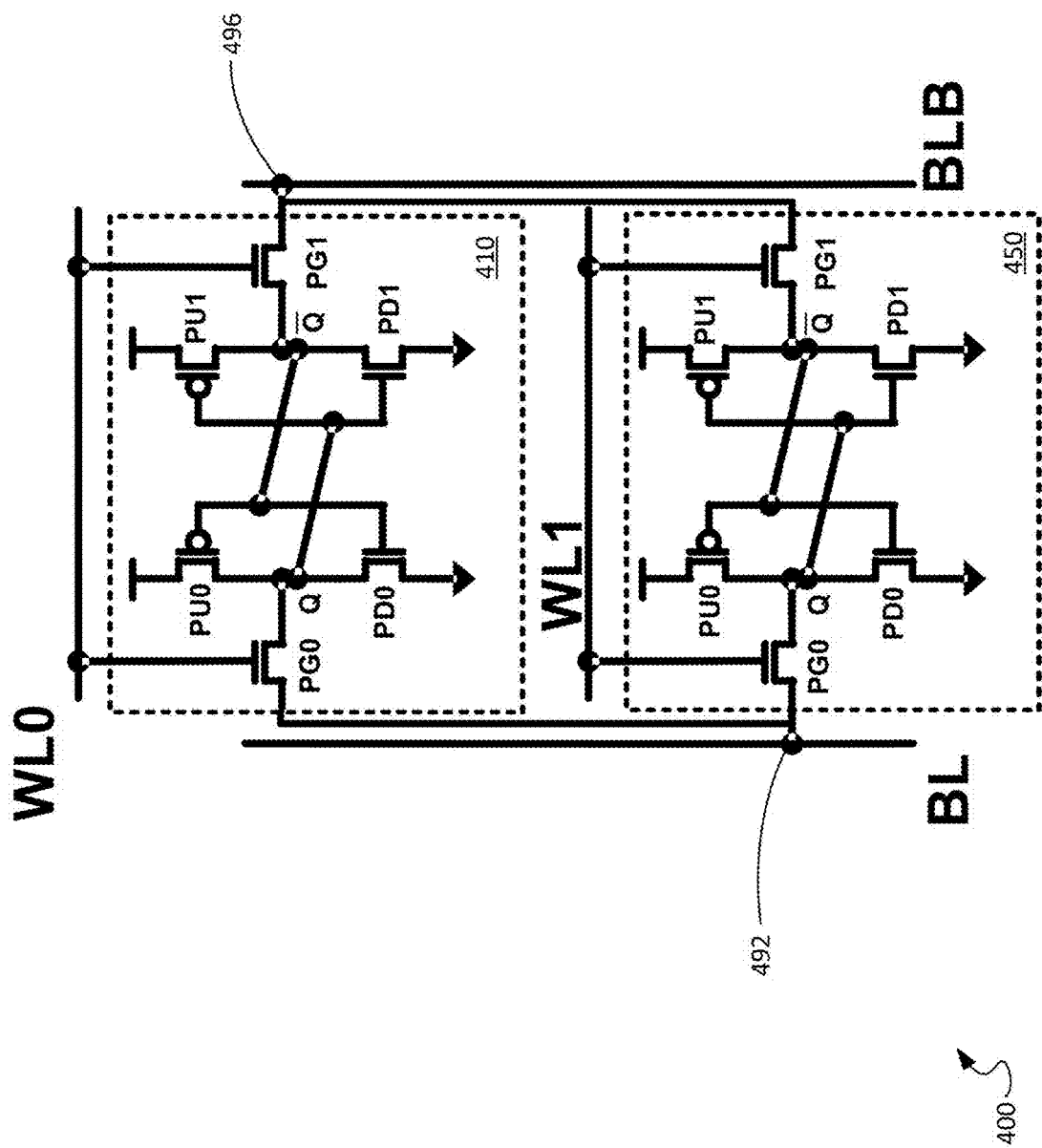
FIG. 8 is a circuit diagram illustrating an example 4Cpp FinFET SRAM cell unit in accordance with some embodiments.

FIG. 8 is a circuit diagram illustrating an example 4Cpp FinFET SRAM cell unit 400 in accordance with some embodiments. The example shown in FIG. 8 generally corresponds to two of the 6T SRAM cells illustrated in FIG. 2 arranged to be connected to the same bit line BL and complementary bit line BLB in a row or column of a memory array, such as the memory array 10 illustrated in FIG. 1. In the example shown, the 4Cpp FinFET SRAM cell unit 400 includes a first bit cell 410 and a second bit cell 450. The example shown in FIG. 8 represents the circuit diagram of the FinFET layout structure illustrated in FIG. 7. In the example shown, the shared connection point 492 connects the first bit cell 410 and the second bit cell 450 to the bit line BL as illustrated in FIG. 7. Similarly, the shared connection point 496 connects the first bit cell 410 and the second bit cell 450 to the complementary bit line BLB as illustrated in FIG. 7.

Figure 9:
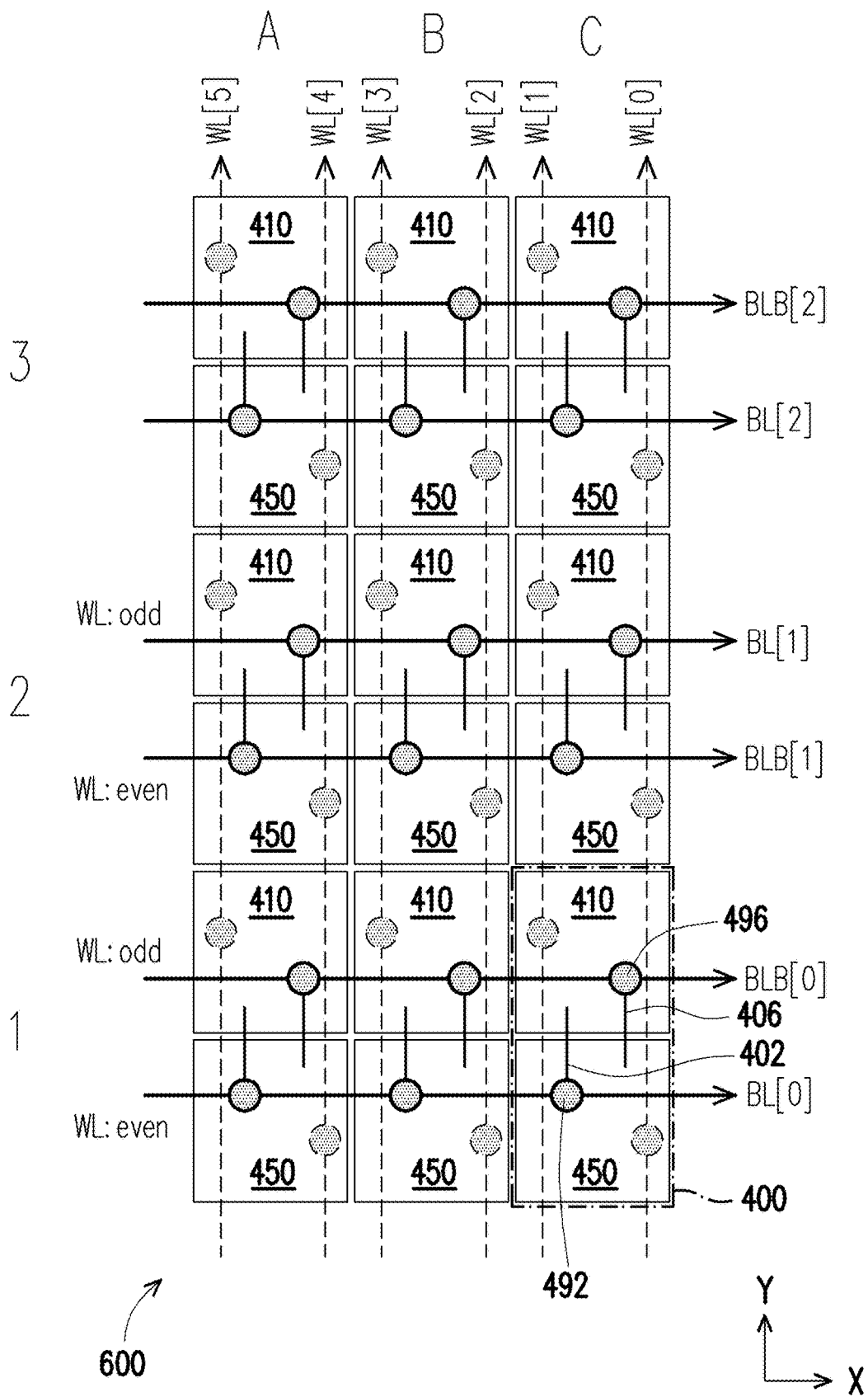
FIG. 9 is a block diagram illustrating an example array of an array of memory cell units in accordance with some embodiments.

FIG. 9 is a block diagram illustrating an example array 600 of an array of memory cell units in accordance with some embodiments. The array 600 includes nine memory cells 400 arranged in a 3×3 grid pattern. In the example shown, the memory cells 400 correspond to the 4Cpp FinFET SRAM cell units 400. The example shown in FIG. 9 illustrates one example word line and complementary bit line arrangement of a memory array device using a 4Cpp FinFET SRAM architecture, such as the 4Cpp FinFET SRAM cell unit 400.

In the embodiment shown, the connection of the bit cells 410 and 450 to the bit line BL are made by the via 492, which is connected to the shared S/D contact 402, which is a shared S/D contact of both the pass gate PG0 transistors of both the bit cells 410 and 450. Similarly, the connection of the bit cells 410 and 450 to the complementary bit line BLB are made by the via 496, which is connected to the shared S/D contact 406, which is a shared S/D contact of both the pass gate PG1 transistors of both the bit cells 410 and 450.

In the example shown, the word line of each of the bit cells 410 in a column are shared, and the word line of each of the bit cells 450 in the column are shared. For example, each of the gates of the PG0 and PG1 transistors of the bit cells 410 in column C are connected to WL1, and each of the gates of the PG0 and PG1 transistors of the bit cells 450 in column C are connected to WL0. Similarly, in the example shown, the bit cells 410 in column B are connected to WL3, the bit cells 450 in column B are connected to WL2, the bit cells 410 in column A are connected to WL5, the bit cells 450 in column A are connected to WL4. In the embodiment shown, the word line arrangement is an "every-other" or an "odd-even" arrangement, in reference to the each bit cell in the column being connected to adjacent word lines in an every other fashion. For example, all of the bit cells 410 in column C are connected to the "odd" word line WL1, and all of the bit cells 450 in column C are connected to the "even" word line WL0. In the embodiment shown, the bit cells 410 in columns A and B are similarly all connected to an "odd" word line, WL5 and WL3 respectively, and the bit cells 450 in columns A and B are similarly all connected to an "even" word line, WL4 and WL2 respectively.

Figure 10:
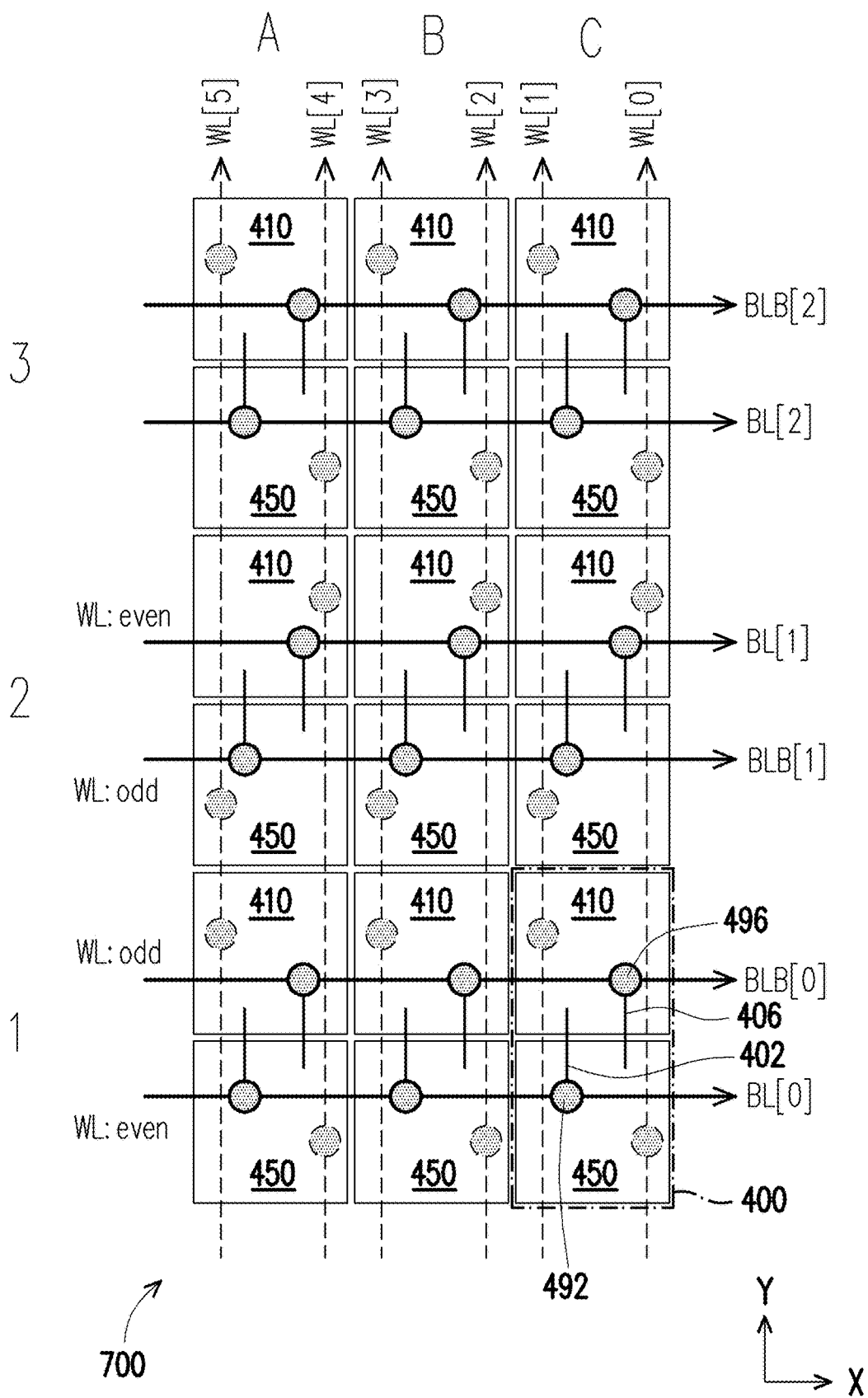
FIG. 10 is a block diagram illustrating another example array of an array of memory cell units in accordance with some embodiments.

FIG. 10 is a block diagram illustrating another example array 700 of an array of memory cell units in accordance with some embodiments. The example shown in FIG. 10 represents an alternative word line connection arrangement to that shown in FIG. 9.

In the embodiment shown, the word line arrangement is an "odd-odd, even-even" arrangement, in reference to the first bit cell 410 of a first 4Cpp FinFET SRAM cell unit 400 being connected to the same word line as the second bit cell 450 of adjacent 4Cpp FinFET SRAM cell unit 400 in the same column. For example, in the embodiment shown, the first bit cell 410 of the cell unit 400 in row 1 and column C is connected to the same word line WL1 as the second bit cell 450 of the cell unit 400 in row 2 and column C. The first bit cell of the cell unit 400 in row 2 and column C is connected to the same word line WL0 as the second bit cell 450 of the cell unit 400 in row 3 and column C, and the pattern repeats with the word line connection switching between WL0 and WL1 every two bit cells, the bit cells being in neighboring cell units 400.

Figure 11:
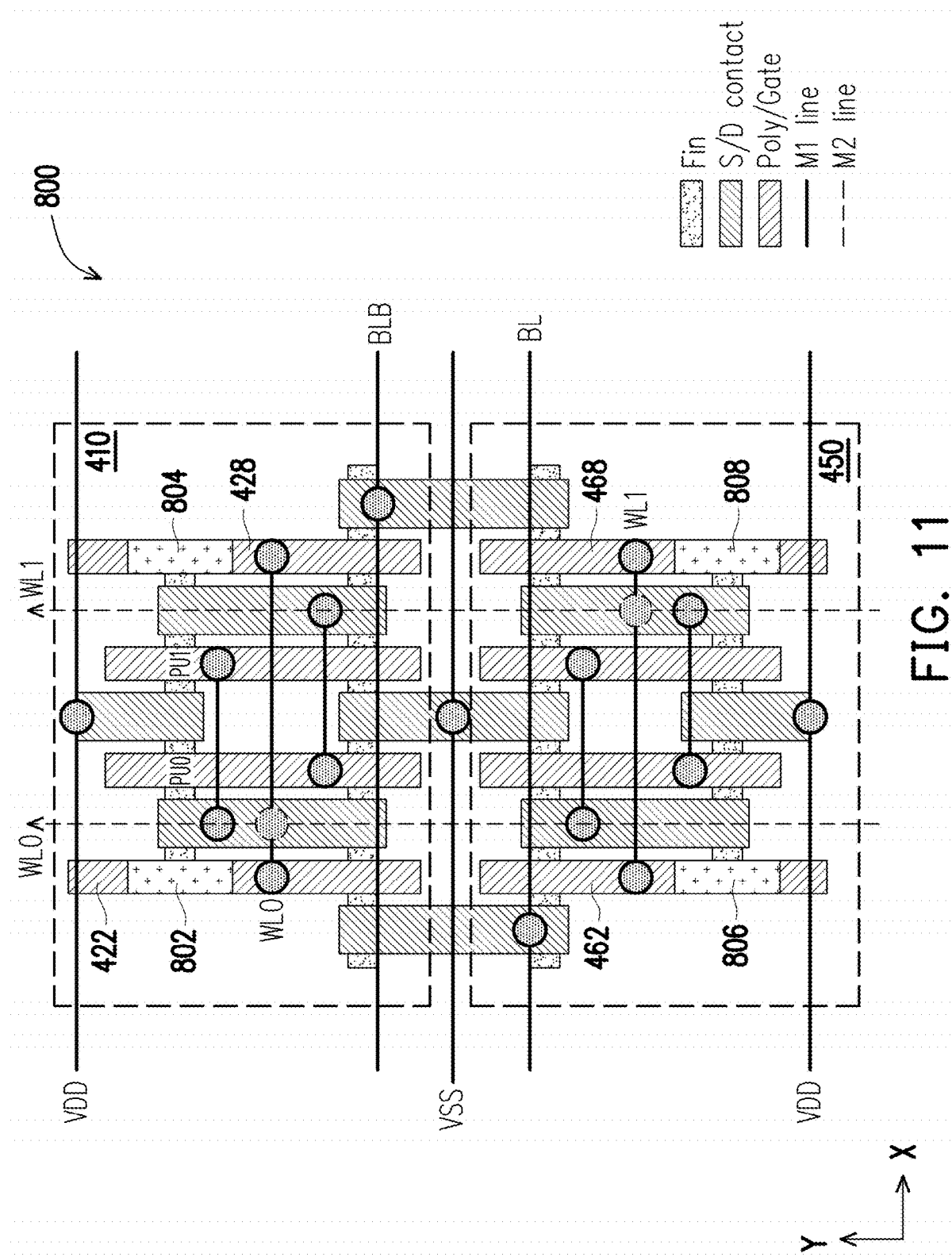
FIG. 11 is a layout diagram illustrating an example 4Cpp FinFET SRAM cell unit in accordance with some embodiments.

FIG. 11 is a layout diagram illustrating an example 4Cpp FinFET SRAM cell unit 800 in accordance with some embodiments. In the example shown, the 4Cpp FinFET SRAM cell unit 800 includes continuous poly on oxide definition edge (CPODE) patterns 802, 804, 806, and 808.

In some embodiments, when a semiconductor device such as a metal-oxide-semiconductor field-effect transistor (MOSFET) is scaled down through various technology nodes, device packing density and device performance are challenged by device layout and isolation. In order to avoid leakage between neighboring devices (cells), the standard cell layout adopts dummy polysilicon segments formed on edges of a silicon oxide definition (OD) region, e.g. a fin in a FinFET, i.e. a poly-on-OD-edge (PODE). The PODE helps to achieve better device performance and better poly profile control. The fin isolation structure has an air gap in a semiconductor fin to separate two neighboring cells, and a dielectric cap layer to cap a top of the air gap for subsequent processes such as metal landing. The air gap has a very low dielectric constant, and is an excellent electrical isolator. Because the air gap is formed within the semiconductor fin, no additional area is needed to form the fin isolation structure, and thus the device size can be shrunk.

In some embodiments, the PODE structures are formed on the edge of a standard cell 100, and are used to protect the ends of the semiconductor fins during processing. That is, the PODE polysilicon structures are not electrically connected as gates for MOS devices but are instead "dummy" structures, having no function in the circuit. The PODE structures cover and protect the ends of the fins in the cells, providing additional reliability during processing.

In some embodiments, a CPODE pattern or a PODE pattern is used to form a trench by removing a dummy material and a portion of a semiconductor body and even a portion of an insulating feature under the dummy material. A dielectric structure is formed by filling the trench with a dielectric material, and no extra mask is needed for the CPODE pattern or the PODE pattern. In some embodiments, the dielectric structure is formed simultaneously with forming other CPODE structures in other portions of the device, such as a capacitor. Forming the dielectric structure simultaneously with forming other CPODE structures helps to avoid a need for additional masks and reduces production costs. By using a CPODE or a PODE pattern, coupling effects between cells causing noise increases, signal delays, logic errors, and integrated circuit malfunctions are reduced in comparison with other approaches because the noise coupling path is cut due to a non-conductive material.

In some embodiments, a dual-port (DP) 4Cpp FinFET SRAM cell unit can be formed. For example, the first and second bit cells 410 and 450 of the 4Cpp FinFET SRAM cell unit 400 can each include two additional pass gate transistors connected to a second bit line BL-2 and a second complementary bit line BL-2. In some embodiments, the second set of complementary bit lines BL-2 and BLB-2 can be connected to different peripheral circuits, thereby connecting at least two peripheral circuits to data lines with access to the data stored in, and read-write operations involving, the bit cells 410 and 450. In some embodiments, dual-port access to the bit cells 410 and 450 allow for faster read-write speed of the memory device 10. In some embodiments, the two additional pass gate transistors in the dual-port 4Cpp FinFET SRAM cell unit can have gates connected to a second set of word lines, for example WL0-2 and WL1-2. Similar with the second set of complementary bit lines, the second set of word lines can be connected to different peripheral circuits, thereby allowing at least two peripheral circuits access to data in each of the bit cells 410 and 450, and allowing at least two peripheral circuits access to read-write operations involving the bit cells 410 and 450. In some embodiments, the dual-port bit lines and connections can be shared between the first and second bit cells 410 and 450.

Figure 12:
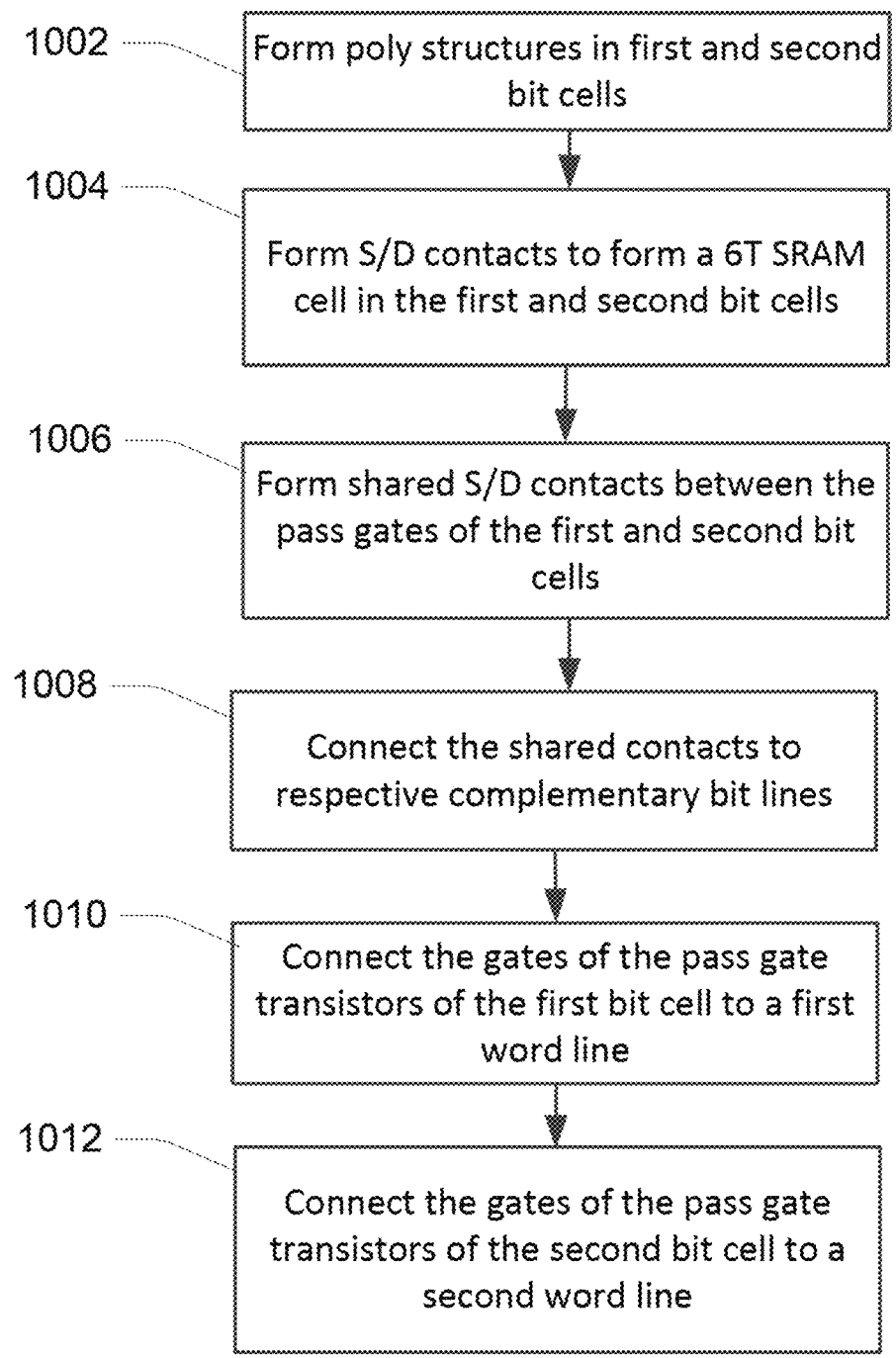
FIG. 12 is an example method of forming a 4Cpp FinFET SRAM cell unit in accordance with some embodiments.

FIG. 12 is an example method 1000 of forming a 4Cpp FinFET SRAM cell unit in accordance with some embodiments. Method 1000 begins at step 1002 in which polysilicon structures are formed in first and second bit cells. For example, the polys 422, 424, 426, and 428 are formed in contact with two fins 412 and 414 in the first bit cell 410, and the polys 462, 464, 466, and 468 are formed in contact with two fins 452 and 454 in the second bit cell 450, as illustrated and described above in relation to FIG. 7. In some embodiments, the poly structures form the gates of FinFET transistors in a 6T SRAM bit cell having a four contacted poly pitch. At step 1004, S/D contacts are formed between the polys and in contact with the fins in the first and second bit cells. For example, the S/D contacts 432, 434, and 436 are formed across and in contact with the fins 412 and 414, and arranged between the polys 422, 424, 426, and 428 as illustrated and described above in relation to FIG. 7. Similarly, the S/D contacts 472, 474, and 476 are formed across and in contact with the fins 452 and 454, and arranged between the polys 462, 464, 466, and 468 as illustrated and described above in relation to FIG. 7. At step 1006, S/D contacts are formed across, and in contact with, the fins of first and second bit cells and are shared by at least the pass gate transistors of the first and second bit cells. For example, the S/D contacts 402, 404, and 406 are formed across and in contact with the fins 412 and 452, with S/D contact 402 being shared by the PG0 transistors of the first and second bit cells, and the S/D contact 406 being shared by the PG1 transistors of the first and second bit cells, as illustrated and described above in relation to FIG. 7. In some embodiments, a shared S/D contact of the first and second bit cells is connected to VDD, for example, the shared S/D contact 404 of FIG. 7.

At step 1008, the shared S/D contacts are connected to bit lines, such as the complementary bit lines BL and BLB in a first metal layer M1. For example, the shared S/D contact 402, being shared between the PG0 transistors of both the first and second bit cells, is connected to the bit line BL as shown in FIG. 7, and the shared S/D contact 406, being shared between the PG1 transistors of both the first and second bit cells, is connected to the complementary bit line BLB as shown in FIG. 7. In some embodiments, the S/D contacts of the pull up transistors PU0 and PU1 of the first and second bit cells are connected to VDD, and the S/D contacts of the pull down transistors PD0 and PD1 of the first and second bit cells are connected to VSS at this step. For example, the S/D contacts 434 and 474 are connected to a VDD line in the M1 layer by the vias 441 and 481, and the S/D contact 404 is connected to a VSS line in the M1 layer by the via 494, as shown above in FIG. 7. In some embodiments, the bit lines BL and BLB, VDD, and VSS are in the M1 layer, and in other embodiments the bit lines BL and BLB, VDD, and VSS can be in any other layer, or combination thereof, and connect to the respective S/D contacts by way of vias and landing pads in other metal layers, as illustrated and described above in relation to FIG. 6.

At step 1010, the gates of the pass gate transistors of the first bit cell are connected to a first word line. For example, the gates of PG0 and PG1, e.g. the polys 422 and 428 respectively, are connected to WL0 as illustrated and described above in relation to FIG. 7. At step 1012, the gates of the pass gate transistors of the second bit cell are connected to a second word line. For example, the gates of PG0 and PG1, e.g. the polys 462 and 468 respectively, are connected to WL1 as illustrated and described above in relation to FIG. 7.

In some embodiments, the word lines, for example WL0 and WL1, are in the second metal layer M2. In other embodiments, the word lines can be in any other layer, or combination thereof, and connect to the respective gates or gate contacts by way of vias and landing pads in other metal layers, as illustrated and described above in relation to FIG. 6.

By forming a 4Cpp FinFET SRAM cell unit, and a memory device 10 comprising 4Cpp FinFET SRAM cell units, the complexity and cost of processing and manufacturing a SRAM device are reduced. Forming a 4Cpp FinFET SRAM cell unit eliminates the need for cutting the OD in bit cells and the associated processing steps, forming shared contacts and associated processing steps, and reduces congestion in the metal layers, for example, the metal layers of the bit lines.

Thus, disclosed embodiments include a static random access memory (SRAM) cell that includes a four-contact polysilicon pitch (4Cpp) fin field effect transistor (FinFET) architecture including a first bit-cell and a second bit cell. The SRAM cell includes a first bit line and a first complementary bit line, wherein the first bit line and the first complementary bit line are shared by the first and second bit-cells of the SRAM cell. The SRAM cell includes a first word line connected to the first bit cell, and a second word line connected to the second bit cell.

In accordance with other disclosed embodiments, a method of forming a static random access memory (SRAM) cell includes forming a four contact polysilicon pitch (4Cpp) fin field effect transistor (FinFET) architecture including a first bit-cell and a second bit cell. The method includes connecting a first bit line to each of the first and second bit-cells, and connecting a first complementary bit line to each of the first and second bit-cells. The method further includes connecting a first word line to the first bit-cell, and connecting a second word line to the second bit-cell.

In accordance with still further disclosed embodiments, a memory array includes a plurality of memory cells arranged in a plurality of rows and columns, each of the plurality of memory cells includes a four contact polysilicon pitch (4Cpp) field effect transistor (FinFET) architecture including a first bit-cell and a second bit cell. The memory array includes a plurality of complementary bit line pairs, wherein each of the first and second bit-cells of each of the plurality of memory cells in first row of the memory array share a first complementary bit line pair and each of the first and second bit-cells of each of the plurality of memory cells in a second row of the memory array share a second complementary bit line pair.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:
a plurality of memory cells arranged in a plurality of rows and columns, each of the plurality of memory cells comprising a first four contact polysilicon pitch (4Cpp) field effect transistor (FinFET) architecture including a first bit-cell and a second 4Cpp FinFET architecture including a second bit-cell;
a first bit line pair, wherein each of the first and second bit-cells of each of the plurality of memory cells in a first row of the memory array share the first bit line pair; and
a plurality of word lines, wherein each of the first bit-cells in a first column of the memory array share a first word line and each of the second bit-cells in the first column of the memory array share a second word line.

2. The memory array of claim 1, wherein each of the first and second bit-cells of each of the plurality of memory cells in a second row of the memory array share a second bit line pair.

3. The memory array of claim 1, wherein each of the first bit-cells of each of the plurality of memory cells in a second column of the memory array share a third word line and each of the second bit-cells of each of the plurality of memory cells in the second column of the memory array share a fourth word line.

4. The memory array of claim 1, wherein each of the first bit-cells of each of the plurality of memory cells in the first row of the memory array share the first word line with the second bit-cells of each of the plurality of memory cells in an adjacent second row and each of the second bit-cells of each of the plurality of memory cells in the first row of the memory array share a second word line with the first bit-cells of each of the plurality of memory cells in the adjacent second row.

5. The SRAM cell of claim 1, wherein the first bit line pair includes a first bit line and a first complementary bit line, and wherein:
the first bit-cell comprises:
first, second, third and fourth polysilicon structures, wherein the first word line is connected to the first and second polysilicon structures;
a first pass gate transistor having a gate including the first polysilicon structure, and a source/drain (S/D) contact connected to the first bit line; and
a second pass gate transistor having a gate including the second polysilicon structure, and a S/D contact connected to the first complementary bit line; and
wherein the second bit-cell comprises:
first, second, third and fourth polysilicon structures, wherein the second word line is connected to the first and second polysilicon structure;
a first pass gate transistor having a gate formed by the first polysilicon structure, and a source contact connected to the first bit line; and
a second pass gate transistor having a gate contact formed by the second polysilicon structure and a source contact connected to the first complementary bit line.

6. The SRAM cell of claim 5, wherein:
the first bit-cell further comprises:
a first inverter comprising first and second transistors each having a gate including the third polysilicon structure and a S/D contact connected to a S/D contact of the first pass gate transistor; and
a second inverter comprising third and fourth transistors each having a gate including the fourth polysilicon structure and a S/D contact connected to a S/D contact of the second pass gate transistor; and
wherein the second bit-cell further comprises:
a first inverter comprising first and second transistors each having a gate including the third polysilicon structure and a S/D contact connected to a S/D contact of the first pass gate transistor; and
a second inverter comprising third and fourth transistors each having a gate including the fourth polysilicon structure and a S/D contact connected to a S/D contact of the second pass gate transistor.

7. The SRAM cell of claim 6, wherein the first bit line comprises a first metal line in a second metal layer, and wherein the first complementary bit line comprises a second metal line in the first metal layer.

8. The SRAM cell of claim 7, wherein the first word line comprises a first metal line in a second metal layer, and wherein the second word line comprises a second metal line in the second metal layer.

9. The SRAM cell of claim 8, wherein the first bit-cell further comprises a first contact in the first metal layer, the first and second polysilicon structures of the first bit-cell being connected to the first contact and the first contact being connected to the first metal line in the second metal layer, and wherein the second bit-cell further comprises a second contact in the first metal layer, the first and second polysilicon structures of the second bit-cell being connected to the second contact and the second contact being connected to the second metal line in the second metal layer.

10. A method, comprising:
arranging a plurality of memory cells in a plurality of rows and columns, each of the plurality of memory cells comprising a first four contact polysilicon pitch (4Cpp) field effect transistor (FinFET) architecture including a first bit-cell and a second 4Cpp FinFET architecture including a second bit-cell;
providing a plurality of bit line pairs including a first bit line pair and a second bit line pair;
connecting the first bit line pair to each of the first and second bit-cells of each of the plurality of memory cells in a first row of the memory array; and
connecting the second bit line pair to each of the first and second bit-cells of each of the plurality of memory cells in a second row of the memory array.

11. The method of claim 10, further comprising:
providing a plurality of word lines including a first word line and a second word line;
connecting each of the first bit-cells of each of the plurality of memory cells in a first column of the memory array to the first word line;
connecting each of the second bit-cells of each of the plurality of memory cells in the first column of the memory array to the second word line.

12. The method of claim 11, wherein the plurality of word lines include a third word line and a fourth word line, the method further comprising:
connecting each of the first bit-cells of each of the plurality of memory cells in a second column of the memory array to the third word line;
connecting each of the second bit-cells of each of the plurality of memory cells in the second column of the memory array to the fourth word line.

13. The method of claim 10, further comprising:
providing a plurality of word lines including a first word line and a second word line;
connecting each of the first bit-cells of each of the plurality of memory cells in the first row of the memory array to the first word line;
connecting each of the second bit-cells of each of the plurality of memory cells in an adjacent second row to the first bit line;
connecting each of the second bit-cells of each of the plurality of memory cells in the first row of the memory array to the second word line; and
connecting each of the first bit-cells of each of the plurality of memory cells in the adjacent second row to the second word line.

14. The method of claim 11, wherein providing the plurality of bit line pairs includes providing the bit line pairs in a first metal layer, and wherein providing the plurality of word line pair includes providing the word lines in a second metal layer.

15. A static random access memory (SRAM) cell, comprising:
a first bit-cell comprising:
first, second, third and fourth polysilicon structures;
a first pass gate transistor having a gate including the first polysilicon structure connected to a first word line, and a first source/drain (S/D) contact connected to a first bit line;
a second pass gate transistor having a gate including the second polysilicon structure connected to the first word line, and a first S/D contact connected to a second bit line;
a second bit-cell comprising:
first, second, third and fourth polysilicon structures;
a first pass gate transistor having a gate including the first polysilicon structure connected to a second word line, and a first S/D contact connected to the first bit line; and
a second pass gate transistor having a gate contact including the second polysilicon structure connected to the second word line, and a first S/D contact connected to the second bit line.

16. The SRAM cell of claim 15,
wherein the first bit-cell further comprises:
a first inverter comprising first and second transistors each having a gate including the third polysilicon structure and a first S/D contact connected to a second S/D contact of the first pass gate transistor; and
a second inverter comprising third and fourth transistors each having a gate including the fourth polysilicon structure and a first S/D contact connected to a second S/D contact of the second pass gate transistor; and wherein the second bit-cell further comprises:
a first inverter comprising first and second transistors each having a gate including the third polysilicon structure and a first S/D contact connected to a second S/D contact of the first pass gate transistor; and
a second inverter comprising third and fourth transistors each having a gate including the fourth polysilicon structure and a S/D contact connected to a S/D contact of the second pass gate transistor.

17. The SRAM cell of claim 16, wherein the first bit line comprises a first metal line in a first metal layer, and wherein the second bit line comprises a second metal line in the first metal layer.

18. The SRAM cell of claim 17, wherein the first word line comprises a first metal line in a second metal layer, and wherein the second word line comprises a second metal line in the second metal layer.

19. The SRAM cell of claim 18, wherein the first bit-cell further comprises a first contact in the first metal layer, the first and second polysilicon structures of the first bit-cell being connected to the first contact and the first contact being connected to the first metal line in the second metal layer, and wherein the second bit-cell further comprises a second contact in the first metal layer, the first and second polysilicon structures of the second bit-cell being connected to the second contact and the second contact being connected to the second metal line in the second metal layer.

20. The SRAM cell of claim 16, wherein each of the first and second polysilicon structures of each of the first and second bit-cells include a continuous poly on diffusion edge (CPODE) pattern.

* * * * *